(12) United States Patent
Kim et al.

(10) Patent No.: US 8,089,301 B2
(45) Date of Patent: *Jan. 3, 2012

(54) INVERTER AND LOGIC DEVICE COMPRISING THE SAME

(75) Inventors: Sun-il Kim, Yongin-si (KR);
Chang-jung Kim, Yongin-si (KR);
Sang-wook Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/805,402

(22) Filed: Jul. 29, 2010

(65) Prior Publication Data

US 2010/0295579 A1  Nov. 25, 2010

Related U.S. Application Data

(63) Continuation of application No. 12/457,907, filed on Jun. 25, 2009, now Pat. No. 7,872,504.

(30) Foreign Application Priority Data

Nov. 10, 2008 (KR) .......................... 10-2008-0111219

(51) Int. Cl.
*H01L 25/00* (2006.01)
*H03K 19/00* (2006.01)
(52) U.S. Cl. .................. 326/101; 326/102; 326/104

(58) Field of Classification Search .................. None
See application file for complete search history.

(56) References Cited

U.S. PATENT DOCUMENTS

| 4,395,726 | A | 7/1983 | Maeguchi |
| 5,744,823 | A | 4/1998 | Harkin et al. |
| 7,087,957 | B2 | 8/2006 | Matsuda |
| 7,872,504 | B2 * | 1/2011 | Kim et al. ..................... 326/120 |
| 2009/0242992 | A1 | 10/2009 | Kim et al. |

FOREIGN PATENT DOCUMENTS

| EP | 0354372 A1 * | 2/1990 |
| JP | 54-004084 | 1/1979 |
| KR | 10-0176176 | 11/1998 |
| KR | 10-2006-0070350 | 6/2006 |
| KR | 10-2006-0133834 | 12/2006 |
| KR | 10-0816498 | 3/2008 |
| WO | WO 2008/143304 A1 | 11/2008 |
| WO | WO 2008143304 A1 * | 11/2008 |

* cited by examiner

*Primary Examiner* — Anh Tran
(74) *Attorney, Agent, or Firm* — Harness, Dickey & Pierce, P.L.C.

(57) ABSTRACT

The inverter includes a driving transistor and a loading transistor having channel regions with different thicknesses. The channel region of the driving transistor may be thinner than the channel region of the load transistor. A channel layer of the driving transistor may have a recessed region between a source and a drain which contact both ends of the channel layer. The driving transistor may be an enhancement mode transistor and the load transistor may be a depletion mode transistor.

11 Claims, 16 Drawing Sheets

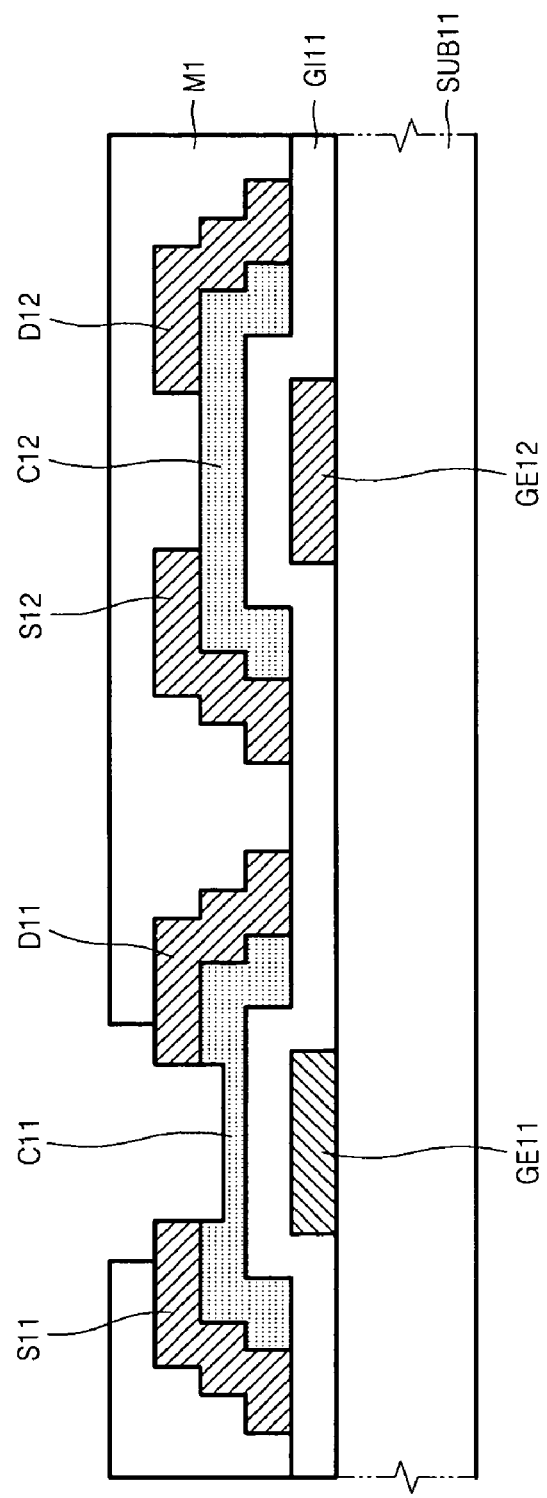

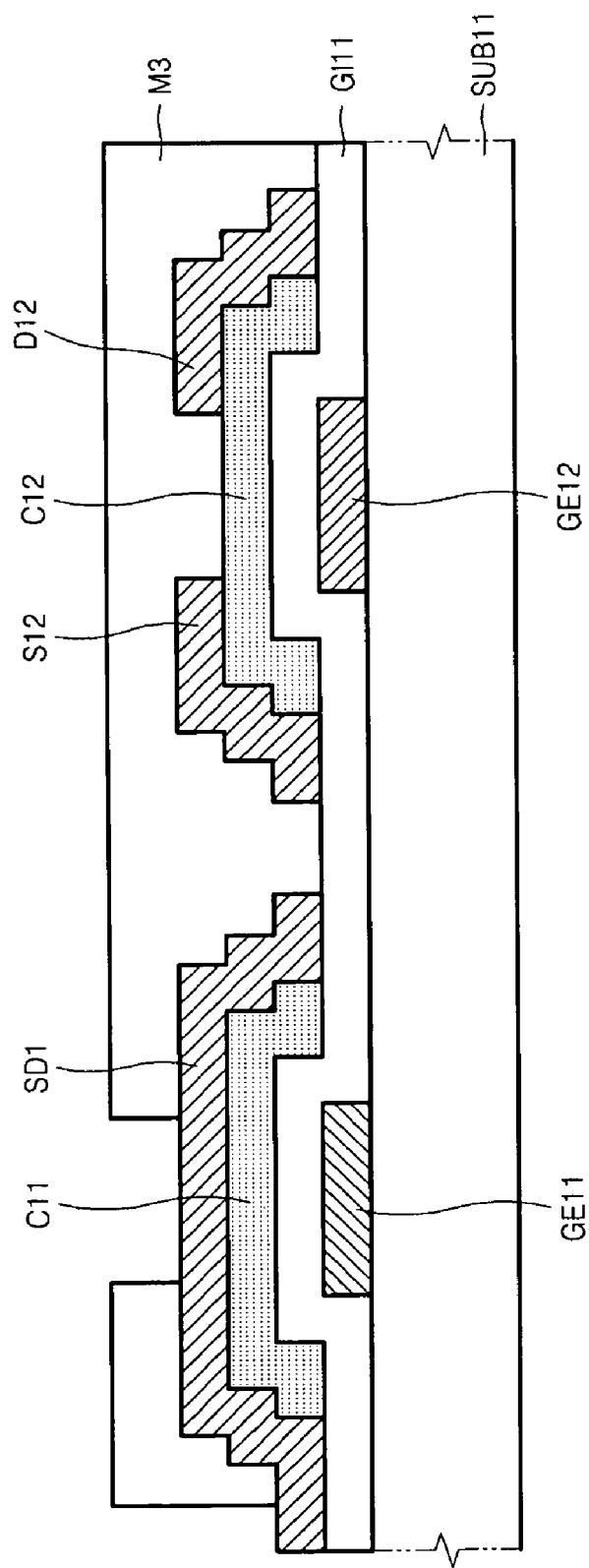

INVERTER AND LOGIC DEVICE COMPRISING THE SAME

CROSS REFERENCE TO RELATED APPLICATION

This U.S. nonprovisional application is a continuation of U.S. application Ser. No. 12/457,907, filed Jun. 25, 2009 now U.S. Pat. No. 7,872,504, which claims priority under 35 U.S.C. §119 to Korean Patent Application No. 10-2008-0111219, filed on Nov. 10, 2008 in the Korean Intellectual Property Office (KIPO), the entire contents of each of which are incorporated herein by reference.

BACKGROUND

1. Field

Example embodiments relate to an inverter and a logic device including the inverter.

2. Description of the Related Art

Various logic devices, e.g., NAND (not and) and NOR (not or) circuits, are used in semiconductor integrated circuits, for example, dynamic random access memories (DRAMs), static random access memories (SRAMs), non-volatile memories, liquid crystal display (LCD) devices, and organic light emitting devices. An inverter is a basic component of logic devices.

In general, a Si-based inverter is a complementary metal-oxide semiconductor (CMOS) inverter including both an n-channel metal-oxide semiconductor (NMOS) transistor and a p-channel metal-oxide semiconductor (PMOS) transistor. When a Si layer is used as a channel layer, the NMOS or PMOS transistor may be easily formed by varying the type of doping elements used for the channel layer, and thus, a CMOS inverter may be easily manufactured. For example, a p-channel layer is formed by doping a Si layer with a Group III element, e.g., boron (B).

However, when a channel layer is formed using an oxide semiconductor, manufacturing a p-channel layer due to the characteristics of the material of the oxide semiconductor is difficult. That is, channel layers formed using an oxide semiconductor are usually n-channel layers. Accordingly, when using a transistor having a channel layer formed of an oxide semiconductor, realizing an inverter having both an n-channel transistor and a p-channel transistor is difficult.

SUMMARY

Example embodiments include an enhancement/depletion (E/D) mode inverter. Example embodiments include a logic device including the inverter. Additional aspects will be set forth in part in the description which follows and, in part, will be apparent from the description, or may be learned by practice of example embodiments.

According to example embodiments, an inverter includes a driving transistor; and a load transistor connected to the driving transistor, wherein thicknesses of channel regions of the driving transistor and the load transistor are different from each other.

The channel region of the driving transistor may be thinner than the channel region of the load transistor. A channel layer of the driving transistor may have a recess region between a source and a drain which contact both ends of the channel layer, respectively. The channel layer of the load transistor may have an overall uniform thickness. The driving transistor may be an enhancement mode transistor, and the load transistor may be a depletion mode transistor.

The driving transistor and the load transistor may be oxide thin film transistors (TFTs). Channel layers of the driving transistor and the load transistor may include a ZnO-based oxide. A thickness of the channel layer in the recess region may be about 1 through 50 nm, and a thickness of the channel layer covered by the source and the drain may be about 10 nm to several hundreds of nm. At least one of the driving transistor and the load transistor may have a bottom-gate structure. At least one of the driving transistor and the load transistor may have a top-gate structure. At least one of the driving transistor and the load transistor may have a double-gate structure.

According to example embodiments, a logic device includes a plurality of the inverters described above. The driving transistor and the load transistor of each of the inverters may include a top gate, and one of the driving transistor and the load transistor may further include a bottom gate. In example embodiments, the bottom gate of each of the inverters may be separated from a top gate which corresponds to the bottom gate, and the bottom gates may be electrically connected to one another.

The driving transistor and the load transistor of each of the inverters may include a bottom gate, and one of the driving transistor and the load transistor may further include a top gate. In example embodiments, the top gate of each of the inverters may be separated from a bottom gate which corresponds to the top gate, and the top gates may be electrically connected to one another. The logic device may be one of a NAND circuit, a NOR circuit, an encoder, a decoder, a multiplexer (MUX), a demultiplexer (DEMUX), and a sense amplifier.

BRIEF DESCRIPTION OF THE DRAWINGS

Example embodiments will be more clearly understood from the following detailed description taken in conjunction with the accompanying drawings. FIGS. 1-13D represent non-limiting, example embodiments as described herein.

FIG. 1 is a cross-sectional view of a transistor according to example embodiments;

FIG. 2 is a cross-sectional view of a transistor according to a comparative example;

FIGS. 3 and 4 are graphs respective showing gate voltage (Vg)-drain current (Id) characteristics of the transistors of FIGS. 1 and 2;

FIG. 5 is a graph illustrating variations in gate voltage (Vg)-drain current (Id) characteristics of the transistor of FIG. 2 according to the thickness of a channel layer;

FIG. 6 is a cross-sectional view of a transistor according to example embodiments;

FIGS. 7 and 8 are cross-sectional views of electric devices including a transistor according to example embodiments;

FIG. 9 is a graph illustrating gate voltage (Vg)-drain current (Id) characteristics of first and second transistors of FIG. 7;

FIG. 10 is a circuit diagram of an inverter according to example embodiments;

FIG. 11 is a graph illustrating input voltage (VI)-output voltage (VO) characteristics of an inverter according to example embodiments;

FIGS. 12A through 12D are cross-sectional views illustrating a method of manufacturing an electric device according to example embodiments; and FIGS. 13A through 13D are cross-sectional views illustrating a method of manufacturing an electric device according to example embodiments.

Figure 1:
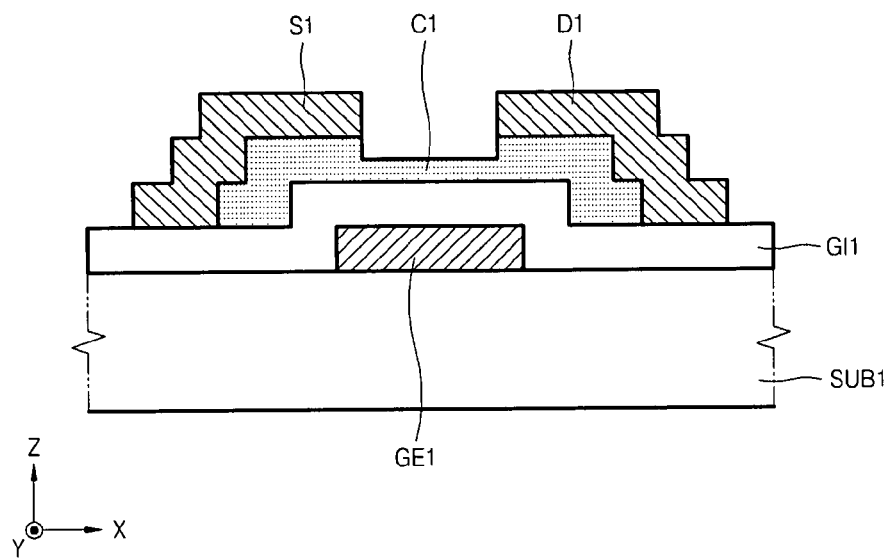

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments of a transistor, an inverter including the transistor, and a logic device including the inverter will now be described more fully with reference to the accompanying drawings in which some example embodiments are shown.

Detailed illustrative example embodiments are disclosed herein. However, specific structural and functional details disclosed herein are merely representative for purposes of describing example embodiments. Example embodiments, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. In the drawings, the thicknesses of layers and regions are exaggerated for clarity. Like reference numerals in the drawings denote like elements.

FIG. 1 illustrates a transistor according to example embodiments. The transistor is a thin film transistor having a bottom-gate structure in which a gate electrode GE1 is disposed below a channel layer C1. Referring to FIG. 1, the gate electrode GE1 is formed on a substrate SUB1. The substrate SUB1 may be one of a silicon substrate, a glass substrate and a plastic substrate, and may be transparent or opaque. The gate electrode GE1 may be formed of a typical conductive material used in the field of electrical devices. A gate insulating layer GI1 covering the gate electrode GE1 may be formed on the substrate SUB1. The gate insulating layer GI1 may be formed of a silicon oxide or a silicon nitride, or other insulating material, e.g., a high-k dielectric material having a greater dielectric constant than a silicon nitride.

The channel layer C1 may be formed on the gate insulating layer GI1 above the gate electrode GE1. The channel layer C1 may have a greater width in the X direction than the width of the gate electrode GE1. The channel layer C1 may be an n-type or a p-type semiconductor layer, and may be an oxide layer. For example, the channel layer C1 may be an n-type semiconductor layer including a ZnO-based material; in example embodiments, the channel layer C1 may further include a Group III element, e.g., In and Ga, a Group IV element, e.g., Sn, or other elements. In other words, the channel layer C1 may be an n-type oxide layer, e.g., ZnO, InGaZnO, InZnO, ZnSnO, ZnO +α, or InZnO +α. The numeral α refers to a doping element that is to be added. When the channel layer C1 is a p-type semiconductor layer, the channel layer C1 may be a Cu oxide layer, a Ni oxide layer, or a Ni oxide layer doped with Ti, or a ZnO-based oxide layer doped with at least one of Group I, Group II and Group V elements, or a ZnO-based oxide layer doped with Ag. When the channel layer C1 is formed of an oxide, a low temperature process may be performed. That is, while a high temperature process is required to form a silicon channel layer, the channel layer C1 according to example embodiments may be formed at a lower temperature.

A source electrode S1 and a drain electrode D1 contacting both ends of the channel layer C1 may be formed. The source electrode S1 and the drain electrode D1 may be formed of a typical conductive material used in the field of electrical devices. The source electrode S1 and the drain electrode D1 may extend over the gate insulating layer GI1. The portion of the channel layer C1 formed between the source electrode S1 and the drain electrode D1 may be recessed to a predetermined or given depth. That is, the channel layer C1 may have a recessed region between the source electrode S1 and the drain electrode D1. Accordingly, the portion of the channel layer C1 between the source electrode S1 and the drain electrode D1 may be thinner than both ends of the channel layer C1 covered by the source electrode S1 and the drain electrode D1. For example, a thickness of the portion of the channel layer C1 between the source electrode S1 and the drain electrode D1 may be about 1 nm to about 50 nm, for example, about 3 nm to about 30 nm, and the thickness of both ends of the channel layer C1 covered by the source electrode S1 and the drain electrode D1 may be about 10 nm to several hundreds of nm.

Although not illustrated in the drawing, a passivation layer covering the channel layer C1, the source electrode S1, and the drain electrode D1 may be formed on the gate insulating layer GI1. The passivation layer may be formed of a silicon oxide, a silicon nitride layer, or other insulating material. As described above, as the portion of the channel layer C1 between the source electrode S1 and the drain electrode D1 are recessed, a threshold voltage of a transistor may vary, for example, the threshold voltage of the transistor may increase. This will be described more in detail later.

Figure 2:
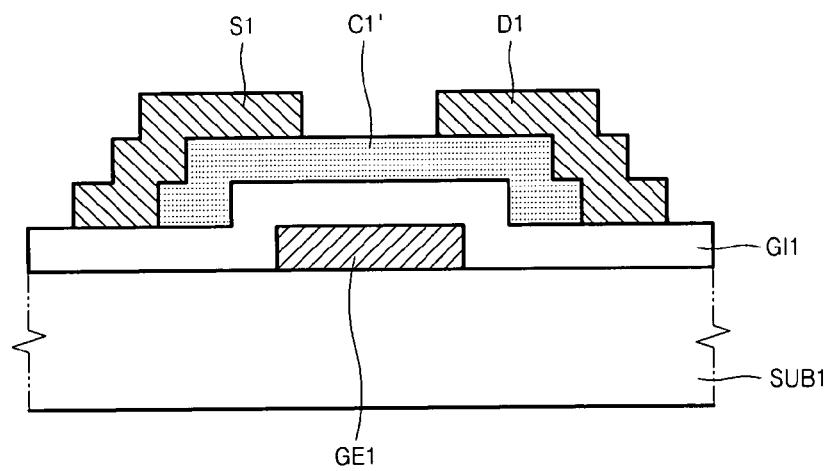

FIG. 2 illustrates a transistor according to a comparative example. Referring to FIG. 2, the transistor according to the comparative example includes a channel layer C1' which is not recessed, that is, a channel layer C1' with an overall uniform thickness. The transistor of FIG. 2 may be identical to the transistor of FIG. 1 except that the channel layer C1' is not recessed.

Figure 3:
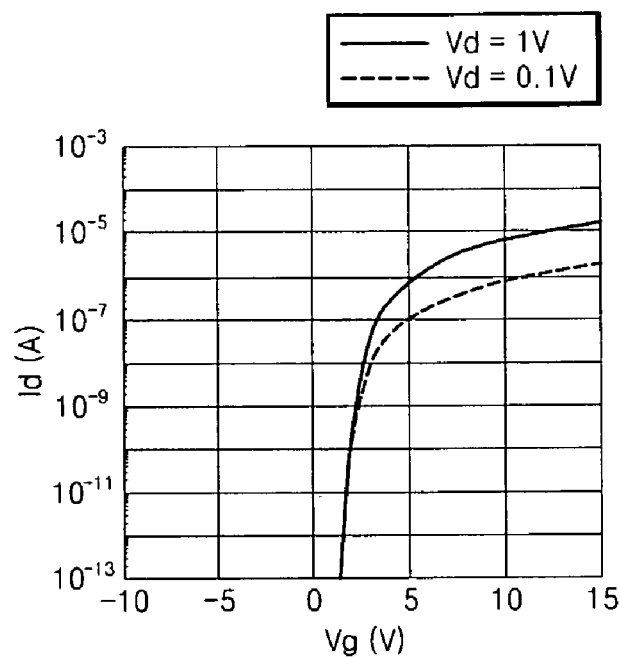
Figure 4:
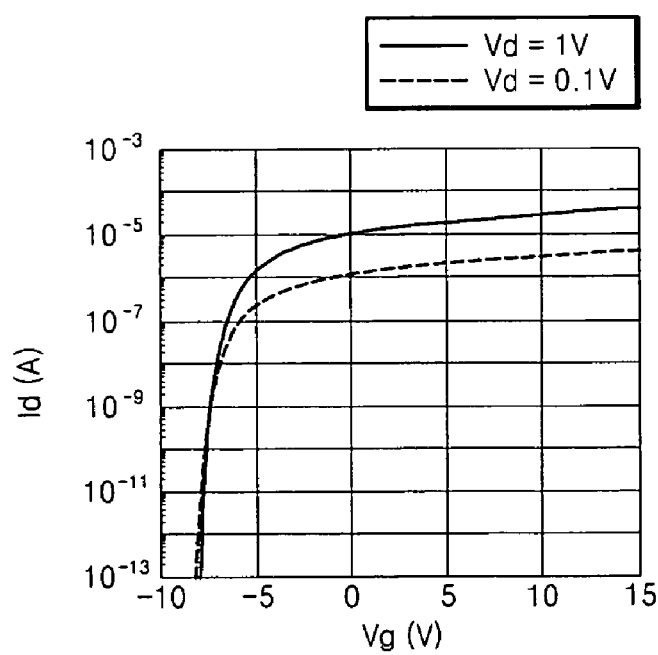

FIGS. 3 and 4 are graphs respectively showing gate voltage (Vg)-drain current (Id) characteristics of the transistors of FIGS. 1 and 2. The channel layers C1 and C1' are ZnO-based n type oxide layers. A thickness of a recessed region of the channel layer C1 of FIG. 1 is about 5 nm, and a thickness of non-recessed region is about 70 nm, and a thickness of the channel layer C1' of FIG. 2 is about 70 nm.

Referring to FIGS. 3 and 4, the graph of FIG. 3 is positioned more to the right side compared to the graph of FIG. 4. A threshold voltage of the transistor of FIG. 1 corresponding to the graph of FIG. 3 is greater than 0, and a threshold voltage of the transistor of FIG. 2 corresponding to the graph of FIG. 4 is smaller than 0. That is, the transistor of FIG. 1 corresponding to the graph of FIG. 3 is an enhancement mode transistor, and the transistor of FIG. 2 corresponding to the graph of FIG. 4 is a depletion mode transistor. As a region of the channel layer between the source electrode and the drain electrode is recessed, the threshold voltage may be increased, and the transistor may be converted from a depletion mode to an enhancement mode. However, the transistor of FIG. 1 is not necessarily an enhancement mode transistor. That is, the threshold voltage may vary (increase), while the transistor is still a depletion mode transistor. Also, the threshold voltage of the transistor may vary or increase according to the recess of the channel layer when the transistor of FIG. 2 is an enhancement mode transistor.

In addition, the slopes of the graphs at a turn-on point and the on-currents in FIGS. 3 and 4 are similar. That is, although the channel layer between the source electrode and the drain electrode is recessed, characteristics of the transistor, e.g., a sub-threshold slope (SS) and ON/OFF current ratio, may not deteriorate.

Figure 5:
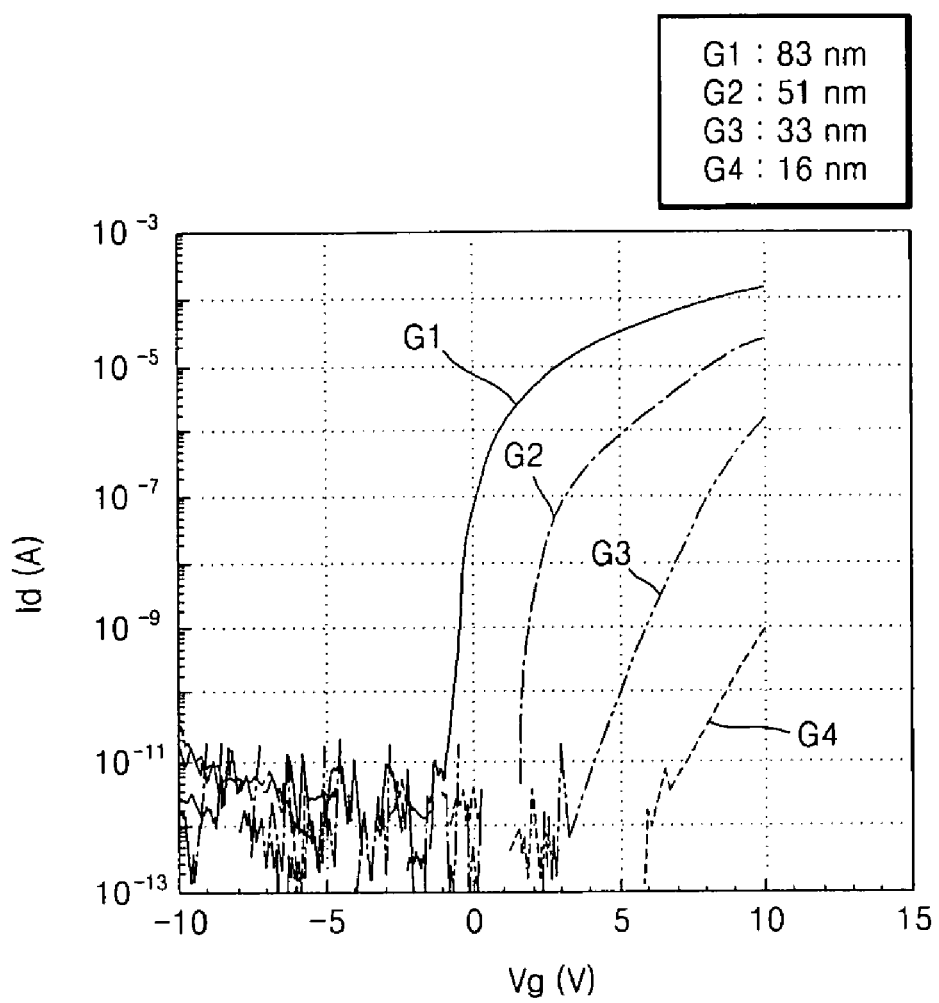

FIG. 5 is a graph illustrating variations in gate voltage (Vg)-drain current (Id) characteristics of the transistor of FIG. 2 according to the thickness of the channel layer C1'. First through fourth graphs G1 through G4 of FIG. 5 respectively relate to the channel layer C1' with a thickness of 83 nm, 51 nm, 33 nm, and 16 nm. The channel layer C1' was a ZnO-based n-type oxide layer.

Referring to FIG. 5, as the thickness of the channel layer C1' is reduced, the graphs move toward the right side, which indicates that the threshold voltage increases. However, the slope of the graphs at a turn-on point tends to decrease as the thickness of the channel layer C1' is decreased, and the ON-current also decreases. In particular, the ON-current decreases significantly. Thus, when the overall thickness of the channel layer C1' decreases, the threshold voltage is increased but the characteristics of the transistor, e.g., the sub-threshold slope and the ON/OFF current ratio, may deteriorate.

Figure 6:
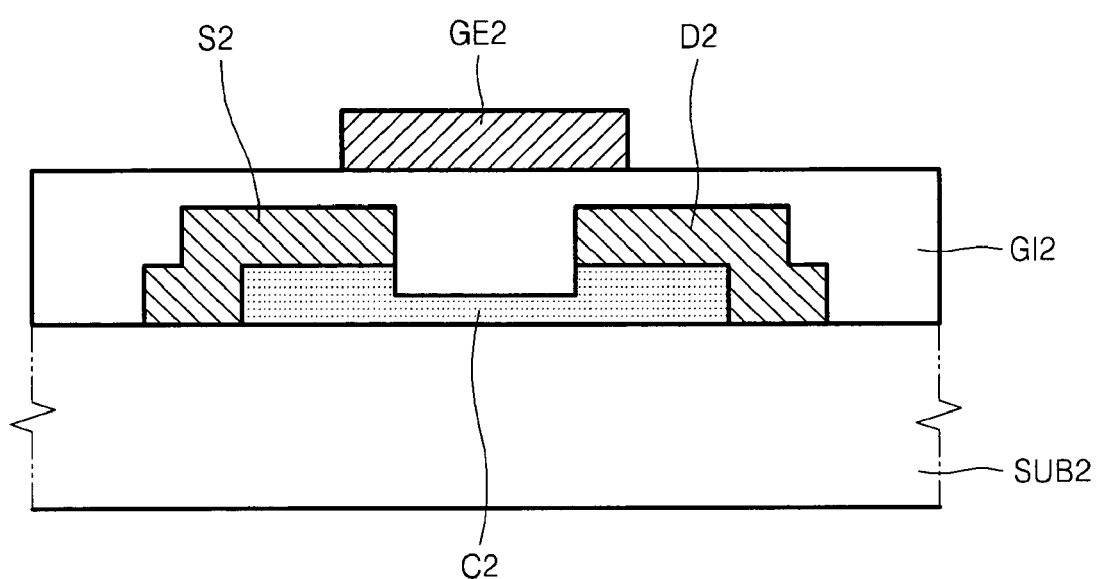

FIG. 6 is a cross-sectional view of a transistor according to example embodiments. The transistor according to example embodiments is a thin film transistor having a top gate structure in which a gate electrode GE2 is formed above a channel layer C2. Referring to FIG. 6, a channel layer C2 may be formed on a substrate SUB2, and a source electrode S2 and a drain electrode D2 may be formed at both ends of the channel layer C2. The portion of the channel layer C2 in a portion between the source electrode S2 and the drain electrode D2 may be recessed to a predetermined or given depth.

Accordingly, the portion of the channel layer C2 between the source electrode S2 and the drain electrode D2 may be thinner than the both ends of the channel layer C2 that are covered by the source electrode S2 and the drain electrode D2. For example, a thickness of the portion of the channel layer C2 between the source electrode S2 and the drain electrode D2 may be about 1 nm to about 50 nm, for example, about 3 nm to about 30 nm, and a thickness of the both ends of the channel layer C2 covered by the source electrode S2 and the drain electrode D2 may be about 10 nm to several hundreds of nm, which is similar to the thicknesses of the portions of the channel layer C1 of FIG. 1. A gate insulating layer GI2 covering the channel layer C2, the source electrode S2, and the drain electrode D2 may be further formed on the substrate SUB2. A gate electrode GE2 may be formed on the gate insulating layer GI2 above the channel layer C2. The substrate SUB2, the channel layer C2, the source electrode S2, the drain electrode D2, the gate insulating layer GI2, and the gate electrode GE2 of FIG. 6 may be respectively formed of the same materials as the substrate SUB1, the channel layer C1, the source electrode S1, the drain electrode D1, the gate insulating layer GI1, and the gate electrode GE1 of FIG. 1.

Also, in example embodiments, as the portion of the channel layer C2 between the source electrode S2 and the drain electrode D2 are recessed, a threshold voltage may vary (e.g., increase). Accordingly, the transistor of FIG. 6 may be a transistor having a controlled threshold voltage, for example, an enhancement mode transistor. The transistors according to example embodiments may be used in various types of electrical devices.

Figure 7:
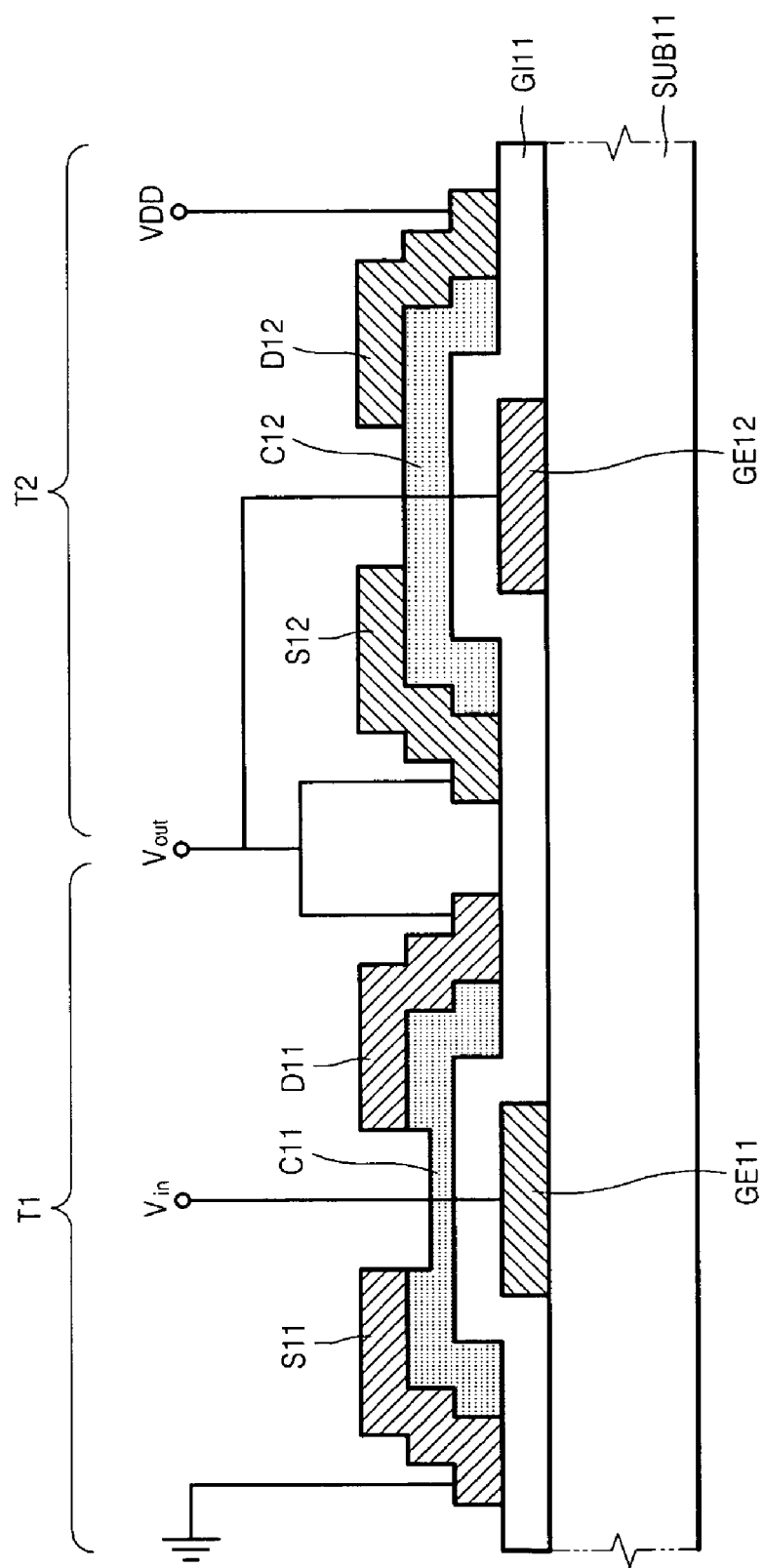
Figure 8:
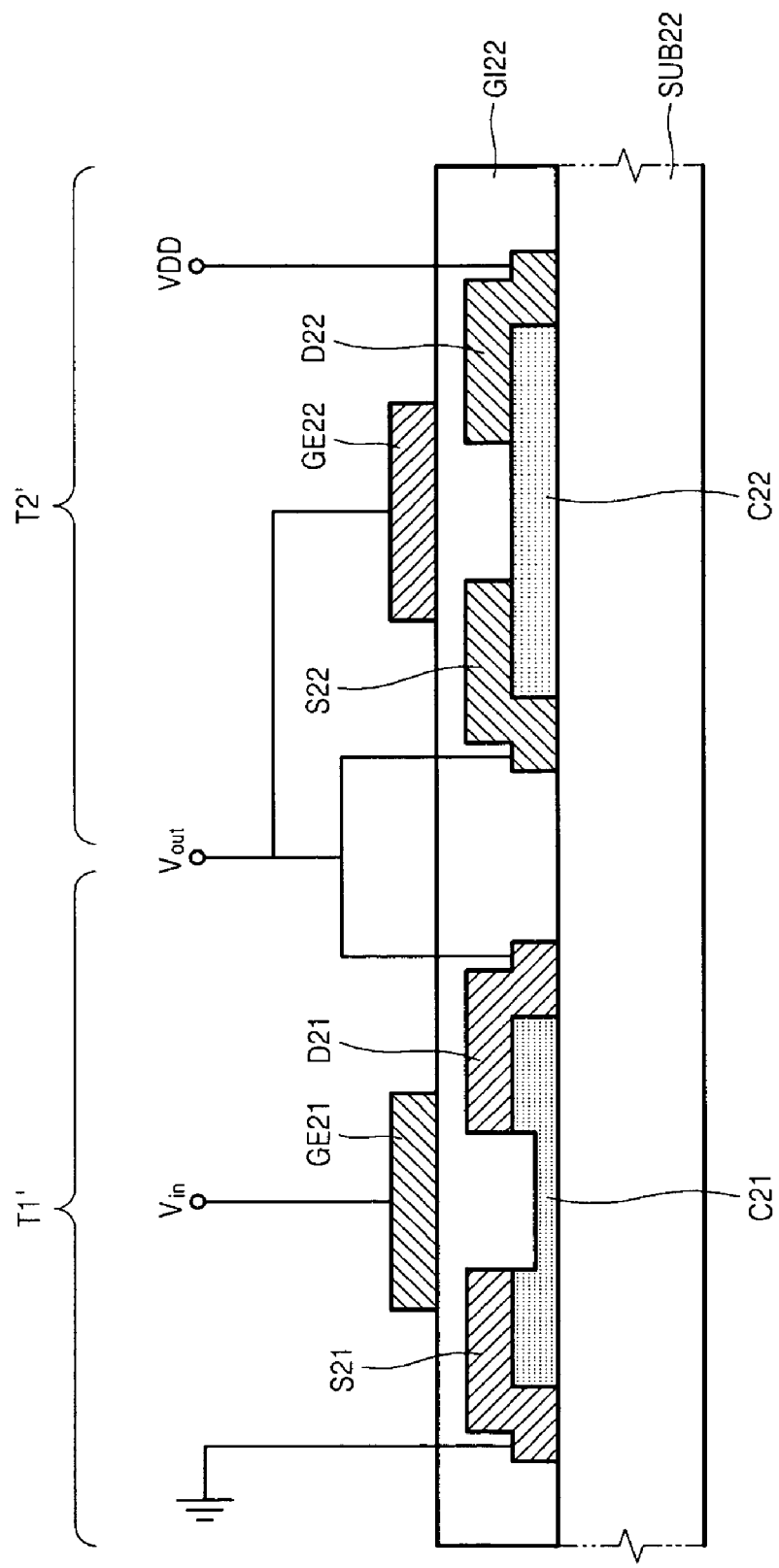

FIGS. 7 and 8 are cross-sectional views of examples of the electrical device including the transistors according to example embodiments. FIG. 7 illustrates an electrical device including a transistor according to example embodiments. The electrical device includes a transistor having the structure illustrated in FIG. 1. Referring to FIG. 7, a first gate electrode GE11 and a second gate electrode GE12 may be formed separately on a substrate SUB11. A gate insulating layer GI11 covering the first and second gate electrodes GE11 and GE12 may be formed on the substrate SUB11. First and second channel layers C11 and C12 may be formed on the gate insulating layer GI11. The first channel layer C11 may be formed above the first gate electrode GE11, and the second channel layer C12 may be formed above the second gate electrode GE12. A first source electrode S11 and a first drain electrode D11 respectively contacting an end of the first channel layer C11, and a second source electrode S12 and a second drain electrode D12 each respectively contacting an end of the second channel layer C12 may be formed on the gate insulating layer GI11. The first drain electrode D11 and the second source electrode S12 may be not separated but be formed as one unit. The portion of the first channel layer C11 between the first source electrode S11 and the first drain electrode D11 may be recessed to a predetermined or given depth.

Thicknesses of the different portions of the first channel layer C11 may be the same as those of the channel layer C1 of FIG. 1. The second channel layer C12 may not be recessed. That is, the second channel layer C12 may have an overall similar or uniform thickness. The thickness of the second channel layer C12 may be equal to the thickness of the unrecessed portions of the first channel layer C11. For example, the thickness of the second channel layer C12 may be about 10 nm to several hundreds of nm. Accordingly, a channel region of the first channel layer C11, that is, the thickness of the portion of the first channel layer C11 between the first source electrode S11 and the first drain electrode D11, may be smaller than a thickness of a channel region of the second channel layer C12, that is, the thickness of the portion of the second channel layer C12 between the second source electrode S12 and the second drain electrode D12.

The first gate electrode GE11, the gate insulating layer GI11, the first channel layer C11, the first source electrode S11, and the first drain electrode D11 may form a first transistor T1, and the second gate electrode GE12, the gate insulating layer GI11, the second channel layer C12, the second source electrode S12, and the second drain electrode D12 may form a second transistor T2. The substrate SUB11, the first and second gate electrodes GE11 and GE12, the gate insulating layer GI11, the first and second channel layers C11 and C12, the first and second source electrodes S11 and S12, and the first and second drain electrodes D11 and D12 may be respectively formed of the same materials of the substrate SUB1, the gate electrode GE1, the gate insulating layer GI1, the channel layer C1, the source electrode S1, and the drain electrode D1 of FIG. 1.

The electrical device illustrated in FIG. 7 may be an inverter. In example embodiments, the first transistor T1 may be a driving transistor, and the second transistor T2 may be a load transistor. A power source VDD may be connected to the second drain electrode D12, and an input terminal Vin may be connected to the first gate electrode GE11. The first drain electrode D11, the second source electrode S12, and the second gate electrode GE12 may be commonly connected to an output terminal Vout, and the first source electrode S11 may be grounded. The second gate electrode GE12 may be grounded instead of being connected to the output terminal Vout.

FIG. 8 illustrates an electrical device including a transistor according to example embodiments. The electrical device of example embodiments may include a transistor having the structure of FIG. 6. Referring to FIG. 8, first and second channel layers C21 and C22 may be formed separately on a substrate SUB22. A first source electrode S21 and a first drain electrode D21 each contacting each end of the first channel layer 21, and a second source electrode S22 and a second drain electrode D22 each contacting each end of the second channel layer C22 may be formed on the substrate SUB22. The first drain electrode D21 and the second source electrode S22 are separated, but they may also be formed as one unit. The portion of the first channel layer C21 between the first source electrode S21 and the first drain electrode D21 may be recessed to a predetermined or given depth. Thicknesses of the portions of the first channel layer C21 may be equal to those of the channel layer C2 of FIG. 6. The second channel layer C22 may not be recessed. The second channel layer C22 may have a thickness equal to the thickness of unrecessed portions of the first channel layer C21. For example, the thickness of the second channel layer C22 may be about 10 nm to several hundreds of nm.

A gate insulating layer GI22 covering the first and second channel layers C21 and C22, the first and second source electrodes S21 and S22, and the first and second drain electrodes D21 and D22 may be formed on the substrate SUB22. First and second gate electrodes GE21 and GE22 may be formed on the gate insulating layer GI22. The first gate electrode GE21 may be formed above the first channel layer C21, and the second gate electrode GE22 may be formed above the second channel layer C22. The first channel layer C21, the first source electrode S21, the first drain electrode D21, the gate insulating layer GI22, and the first gate electrode GE21 may form a first transistor T1', and the second channel layer C22, the second source electrode S22, the second drain electrode D22, the gate insulating layer GI22, and the second gate electrode GE22 may form a second transistor T2'. The materials of the substrate SUB22, the first and second gate electrodes GE21 and GE22, the gate insulating layer GI22, the first and second channel layers C21 and C22, the first and second source electrodes S21 and S22, and the first and second drain electrodes D21 and D22 may be respectively the same as the materials of the substrate SUB1, the gate electrode GE1, the gate insulating layer GI1, the channel layer C1, the source electrode S1, and the drain electrode D1 of FIG. 1.

The electrical device of FIG. 8 may be an inverter, and in example embodiments, the first and second transistors T1' and T2' may be a driving transistor and a load transistor, respectively. The connection between terminals, e.g., the power source VDD, the input terminal Vin, the output terminal Vout, and a grounding (not shown), and the source electrodes S21 and S22, the drain electrodes D21 and D22, and the gate electrodes GE21 and GE22 of the first and second transistors T1' and T2' may be similar to that of FIG. 7. The second gate electrode GE22 may be grounded instead of being connected to the output terminal Vout.

In FIGS. 7 and 8, the first transistors T1 and T1' and the second transistors T2 and T2' may have different threshold voltages from each other. As the portions of the first channel layers C11 and C21 between the first source electrodes S11 and S21 and the first drain electrodes D11 and D21 are recessed, the threshold voltage of the first transistors T1 and T1' may increase, and the threshold voltage of the first transistors T1 and T1' may be greater than that of the second transistors T2 and T2'. For example, the first transistors T1 and T1' may be enhancement mode transistors with a threshold voltage greater than 0, and the second transistors T2 and T2' may be depletion mode transistors having a threshold voltage smaller than 0. Accordingly, the inverter according to example embodiments may be an enhancement/depletion (E/D) inverter.

In addition, even when the thickness of the second channel layers C21 and C22 is smaller, for example, about 10 nm, due to the material of the second channel layers C21 and C22, the second transistors T2 and T2' may have the characteristics of a depletion mode transistor. In example embodiments, when the first channel layers C11 and C21 are formed of the same material as the second channel layers C21 and C22, the thickness of the recessed portions of the first channel layers C11 and C21 may be smaller than about 10 nm. Also, according to example embodiments, the recessed portions may be formed in the second channel layers C12 and C22 between the second source electrodes S12 and S22 and the second drain electrodes D12 and D22 in FIGS. 7 and 8. In example embodiments, the depth of the recessed portions of the first channel layers C11 and C21 may be deeper than the depth of the recessed portions of the second channel layers C12 and C22, and the first transistors T1 and T1' may be enhancement mode transistors, and the second transistor T2 and T2' may be depletion mode transistors.

Figure 9:
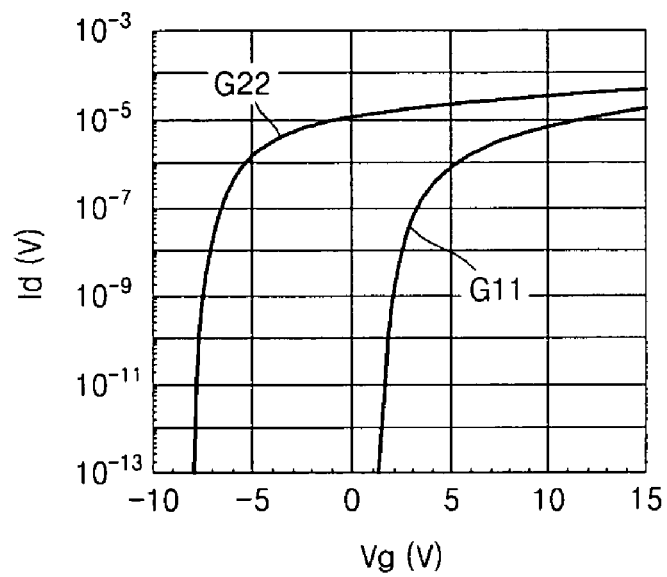

FIG. 9 is a graph illustrating gate voltage (Vg)-drain current (Id) characteristics of the first and second transistors T1 and T2 of FIG. 7. A first graph G11 shows a result corresponding to the first transistor T1, and the second graph G22 shows a result corresponding to the second transistor T2. A drain voltage Vd used for obtaining the result of FIG. 9 was about 1 V.

Referring to FIG. 9, a threshold voltage in the first graph G11 is greater than 0, and a threshold voltage in the second graph G22 is smaller than 0. This indicates that the first transistor T1 of FIG. 7 corresponding to the first graph G11 may be an enhancement mode transistor, and the second transistor T2 of FIG. 7 corresponding to the second graph G22 may be a depletion mode transistor.

Figure 10:
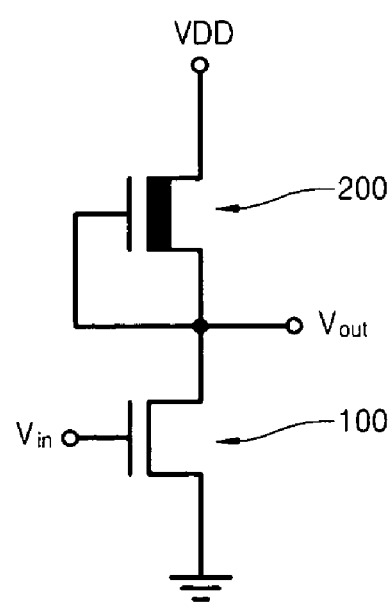

The structure of the transistors illustrated in FIGS. 7 and 8 may be expressed in a circuit diagram as illustrated in FIG. 10. That is, FIG. 10 is a circuit diagram of an inverter according to example embodiments. A driving transistor 100 may correspond to the first transistors T1 and T1' of FIGS. 7 and 8, and a load transistor 200 may correspond to the second transistors T2 and T2' of FIGS. 7 and 8.

Referring to FIG. 10, the driving transistor 100, which is an enhancement mode transistor, and the load transistor 200, which is a depletion mode transistor, are connected to each other. A power source VDD may be connected to a drain of the load transistor 200, and a gate of the driving transistor 100 may be connected to an input terminal Vin. A gate and a source of the load transistor 200 and a drain of the driving transistor 100 may be commonly connected to an output terminal Vout. A source of the driving transistor 100 may be grounded. The gate of the load transistor 200 may be grounded instead of being connected to the output terminal Vout.

While a voltage of 0 V is applied to the input terminal Vin, that is, while the driving transistor 100 is turned off, when a high level power voltage is applied to the drain of the load transistor 200 via the power source VDD, a high level voltage is detected at the output terminal Vout. While the power voltage is continuously applied to the drain of the load transistor 200, and when a voltage greater than the threshold voltage is applied to the input terminal Vin to turn on the driving transistor 100, most current flows to ground through the driving transistor 100. Accordingly, a low level voltage is detected at the output terminal Vout. That is, while the power source voltage is fixed, the voltage output to the output terminal Vout may be varied according to the voltage applied to the input terminal Vin.

Figure 11:
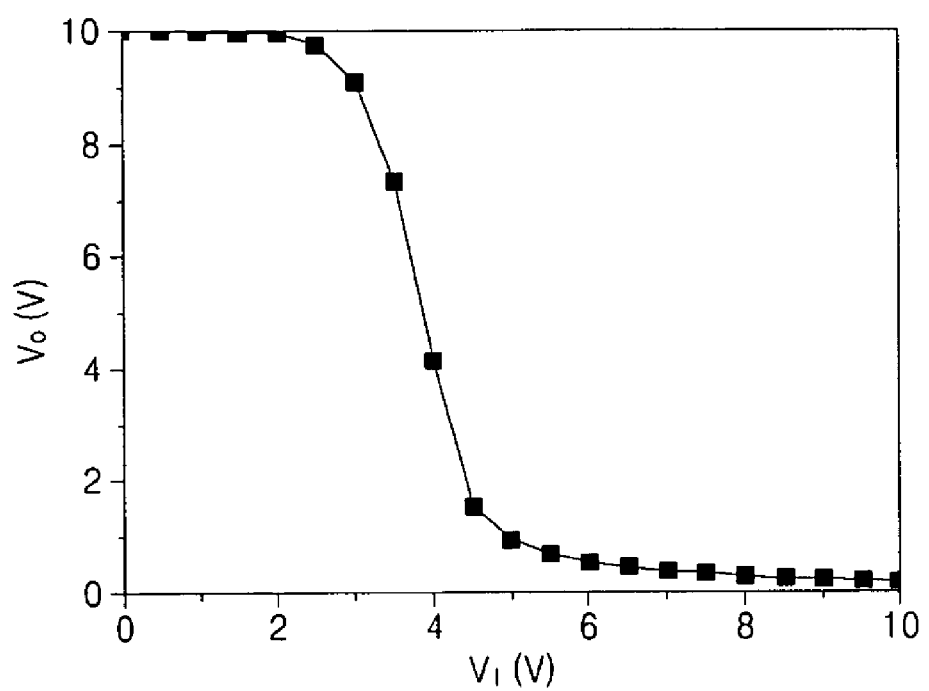

FIG. 11 is a graph illustrating input voltage (VI)-output voltage (VO) characteristics of an inverter according to example embodiments. A power source voltage used to obtain the result of FIG. 11 was about 10 V. The input voltage VI and the power voltage are voltages each applied to the input terminal Vin and the power source VDD of FIG. 10, respectively, and the output voltage VO is a voltage detected at the output terminal Vout of FIG. 10.

Referring to FIG. 11, when the input voltage VI is 0 V, the output voltage VO is at a high level which is similar to a power source voltage. However, as the input voltage VI is increased to about 4.5 V or greater, the output voltage VO is dropped to almost 0 V. Accordingly, when using the inverter according to example embodiments, full swing characteristics as that of a Si-based complementary metal oxide semiconductor (CMOS) inverter may be obtained.

Generally, when an oxide is used to form a channel layer, realizing an enhancement mode transistor and a p-channel transistor may be difficult, and accordingly, manufacturing a complementary device may be difficult. However, according to example embodiments, an enhancement mode oxide transistor may be more easily obtained by recessing a channel region between a source and a drain, and an E/D inverter having the characteristics as that of a CMOS inverter may be manufactured.

Although not illustrated in the drawing, at least one of the first transistors T1 and T1' and the second transistors T2 and T2' may have a double-gate structure in the inverter of FIGS. 7 and 8. For example, a top gate electrode may be disposed above at least one of the first and second channel layers C11 and C12 of FIG. 7. Another gate insulating layer may be formed between the top gate electrode and the channel layer corresponding to the top gate electrode. Also, a bottom gate electrode may be formed below at least one of the first and second channel layers C21 and C22 of FIG. 8. Another gate insulating layer may be formed between the bottom gate electrode and a channel layer corresponding to the bottom gate electrode.

The inverter illustrated in FIGS. 7 and 8 may be applied as an element of various kinds of electrical devices. For example, the first and second transistor T1 and T2 of FIG. 7 and the first and second transistors T1' and T2' of FIG. 8 may be used as elements of various logic devices, e.g., a NAND device, a NOR device, an encoder, a decoder, a multiplexer (MUX), a demultiplexer (DEMUX), and a sense amplifier.

The logic devices may include a plurality of inverters. A driving transistor and a load transistor of each of the inverters in the logic device may include a top gate, and one of the driving transistor and the load transistor may further include a bottom gate. In example embodiments, the bottom gate may be separated from a top gate corresponding thereto in each of the inverters, and the bottom gates may be electrically connected to one another. In addition, the driving transistor and the load transistor of each of the inverters may include a bottom gate, and one of the driving transistor and the load transistor may further include a top gate. In example embodiments, the top gate may be separated from a bottom gate corresponding thereto in each of the inverters, and the top gates may be electrically connected to one another. As the basic structure of the above-described logic devices, e.g., a NAND device and a NOR device, are well known in the art, detailed description thereof will be omitted.

The inverter according to example embodiments and logic devices including the inverter may be applied in various devices, e.g., a liquid crystal display device, an organic light emitting display device, and a memory device. In this regard, when the inverter according to example embodiments may include an oxide thin film transistor, the oxide thin film transistor may be formed using a relatively low temperature process and has improved mobility. For example, a logic device, e.g., an E/D inverter formed of an oxide thin film transistor according to example embodiments, may be used as a peripheral device of a 3-dimensional stack memory, e.g., a 1D(diode)-1R(resistor) multi-layer cross point memory device which may be formed using a relatively low temperature process.

Hereinafter, a method of manufacturing an electrical device including a transistor according to example embodiments will be described. FIGS. 12A through 12D are cross-sectional views illustrating a method of manufacturing an electrical device according to example embodiments.

Figure 12A:
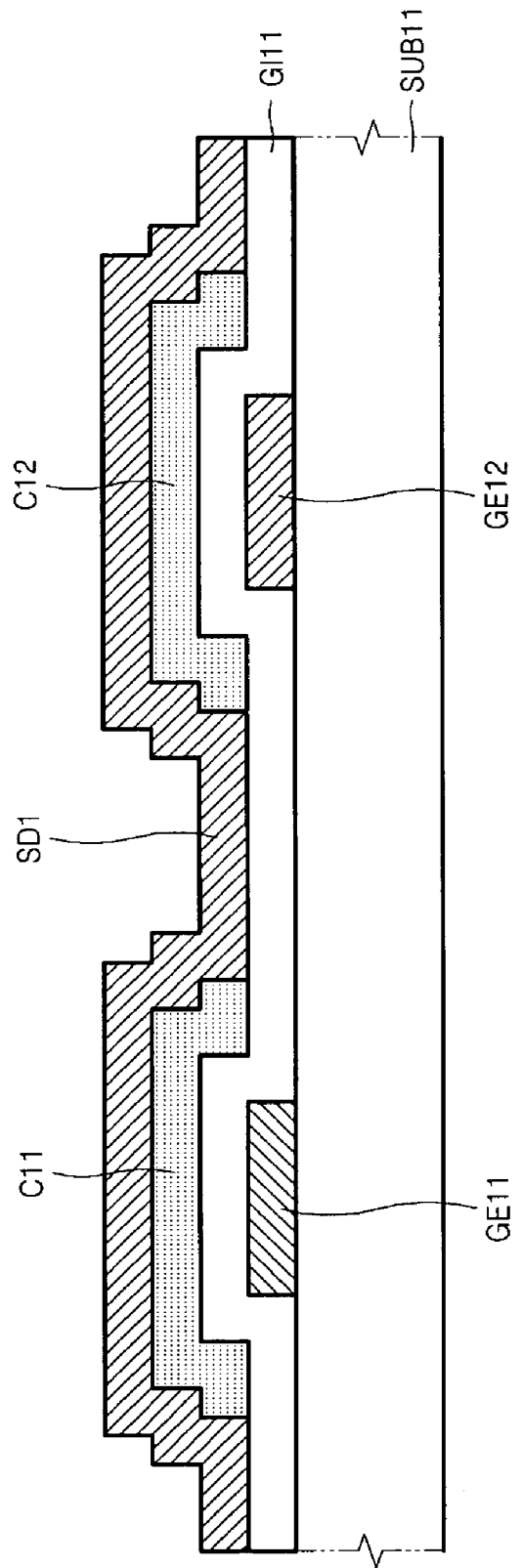

Referring to FIG. 12A, a first gate electrode GE11 and a second gate electrode GE12 may be formed separately on a substrate SUB11, and a gate insulating layer GI11 covering the first and second gate electrodes GE11 and GE12 may be formed. First and second channel layers C11 and C12 may be formed on the gate insulating layer GI11. The first channel layers C11 may be formed above the first gate electrode GE11, and the second channel layer C12 may be formed above the second gate electrode GE12. A source/drain material layer SD1 covering the first and second channel layer C11 and C12 may be formed on the gate insulating layer GI11.

Figure 12B:
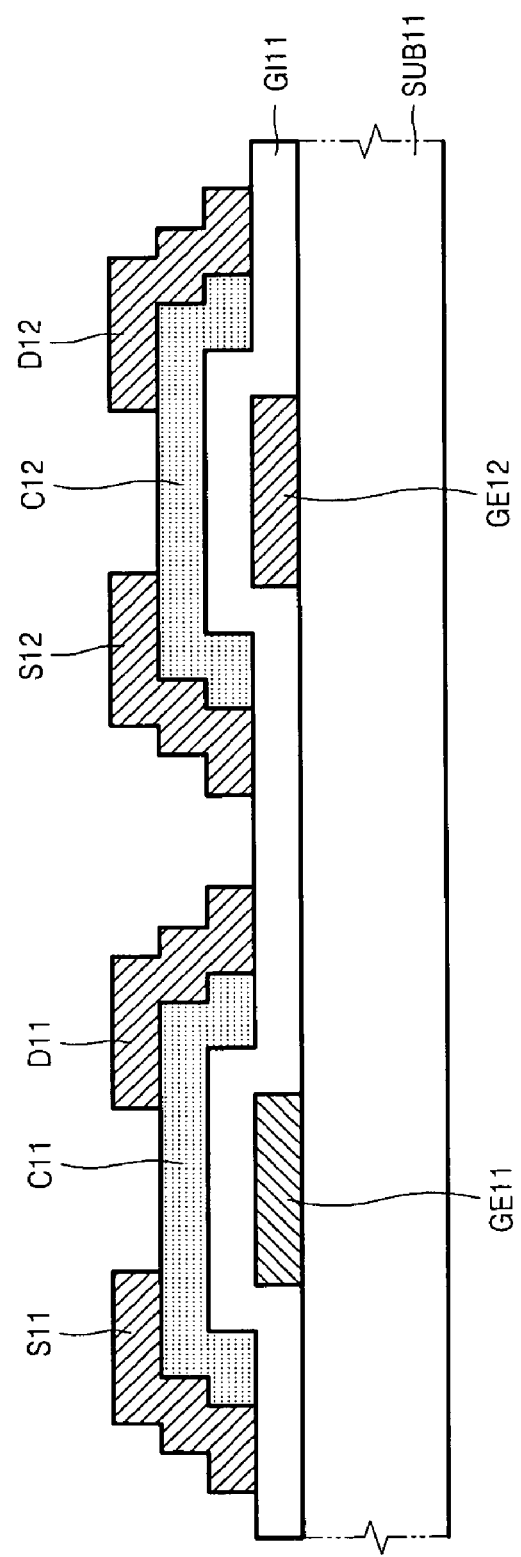

The source/drain material layer SD1 may be patterned to form a first source electrode S11 and a first drain electrode D11 contacting both ends of the first channel layer C11 and a second source electrode S12 and a second drain electrode D12 contacting both ends of the second channel layer C12 as illustrated in FIG. 12B. Also, the first drain electrode D11 and the second source electrode S12 may be formed as a single unit. The source/drain material layer SD1 may be patterned using an etching gas that selectively etches the source/drain material layer SD1 only and not the first and second channel layers C11 and C12. For example, when the source/drain material layer SD1 is a metal, e.g., Mo, and the first and second channel layers C11 and C12 are oxides, the source/drain material layer SD1 may be pattered using $SF_6$-based etching gas. Accordingly, when patterning the source/drain material layer SD1, the first and second channel layers C11 and C12 may be hardly etched or not etched at all.

Figure 12C:
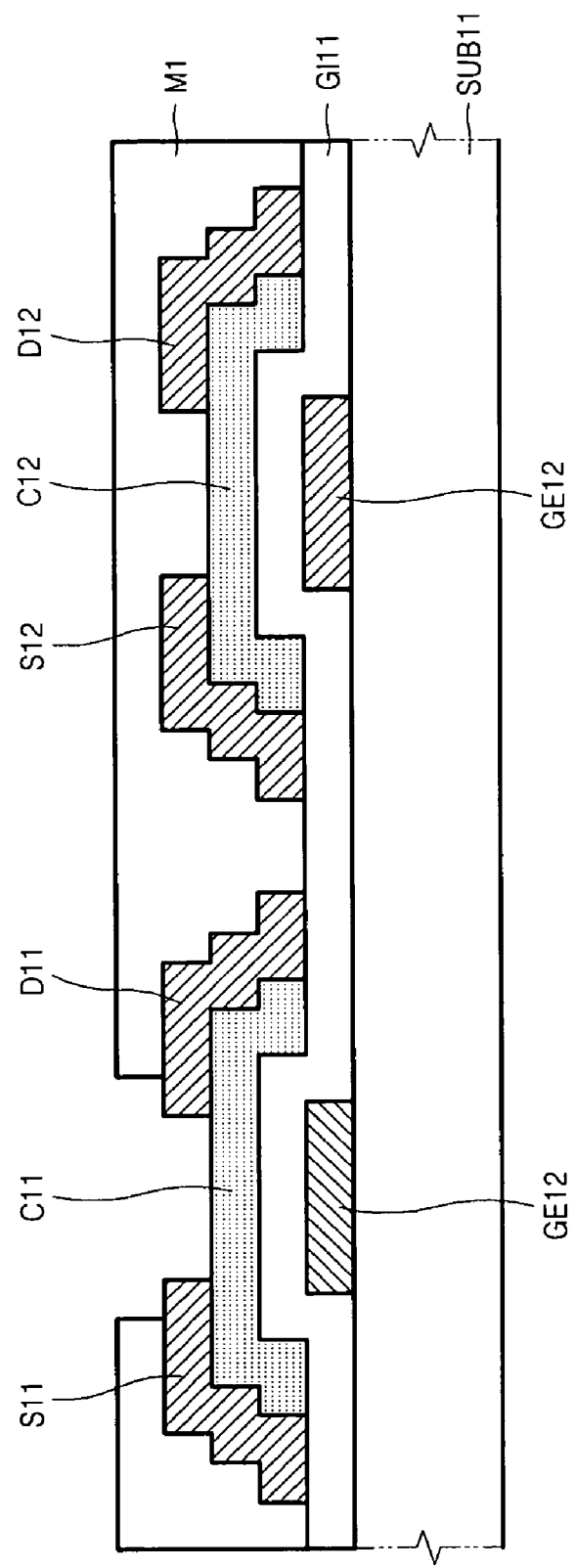

Referring to FIG. 12C, a first mask layer M1 exposing the first channel layer C11 between the source electrode S11 and the first drain electrode D11 may be formed on the gate insulating layer GI11. Ends of the first source electrode S11 and the first drain electrode D11 may also be exposed, which are adjacent to the exposed portion of the first channel layer C11. The first mask layer M1 may be a resin layer, e.g., a photosensitive layer.

An etching process is performed with respect to the exposed first channel layer C11. The result of the etching is illustrated in FIG. 12D. Referring to FIG. 12D, the portion of the first channel layer C11 between the first source electrode S11 and the first drain electrode D11 is recessed to a predetermined or given thickness. To etch the exposed first channel layer C11, a wet etching method or a dry etching method may be used. When using a wet etching method, an etching solution containing at least one of hydrochloric acid, fluoric acid, and phosphoric acid, and an aqueous solution of acetic acid may be used. As a result of the wet etching, under-cuts may be generated under end portions of the first source electrode S11 and the first drain electrode D11.

However, the degree of the under-cuts may be small and not affect the operation of the transistor. When using a dry etching method, etching gas that selectively etches the first channel layer C11 only may be used, or etching gas that etches the first channel layer C11 and the source/drain material layer SD1 may be used. When the latter etching gas is used, exposed portions of the first source electrode S11 and the first drain electrode D11 may be etched to some degree but this may not affect the operation of the transistor. In detail, when recessing the exposed first channel layer C11 using Cl-based etching gas, exposed portions of the first source electrode S11 and the first drain electrode D11 may also be etched to some degree. However, when an etching gas that selectively etches the first channel C11 only is used, the first source electrode S11 and the first drain electrode D11 may be hardly damaged or not damaged at all. The recess depth of the first channel layer C11 may be controlled by adjusting the etching time of the above-described wet etching method and the dry etching method. According to the above methods, only a predetermined or given region of the first channel layer C11 may be selectively recessed among the first and second channel layers C11 and C12.

Although not illustrated in the drawing, the first mask layer M1 is removed, and a passivation layer covering the first and second channel layers C11 and C12, the first and second source electrodes S11 and S12, and the first and second drain electrodes D11 and S12 may be formed. The resultant product may be annealed at a predetermined or given temperature.

When the channel layers of the two transistors are formed to have different but uniform thicknesses, that is, when the thicknesses of the channel layers of the two transistors are formed to be different overall, the manufacturing process is complicated and an interface between the channel layer and the source/drain electrodes may be damaged. Also, when the channel layer is formed to have a relatively small thickness throughout in order to control a threshold voltage, the characteristics of the transistor may deteriorate as described with reference to FIG. 5. However, according to example embodiments, only a region between the source electrode and the drain electrode of one of the two channel layers is recessed, and thus, the manufacturing process is simple and deterioration of the transistor characteristics may also be prevented or reduced.

Figure 13A:
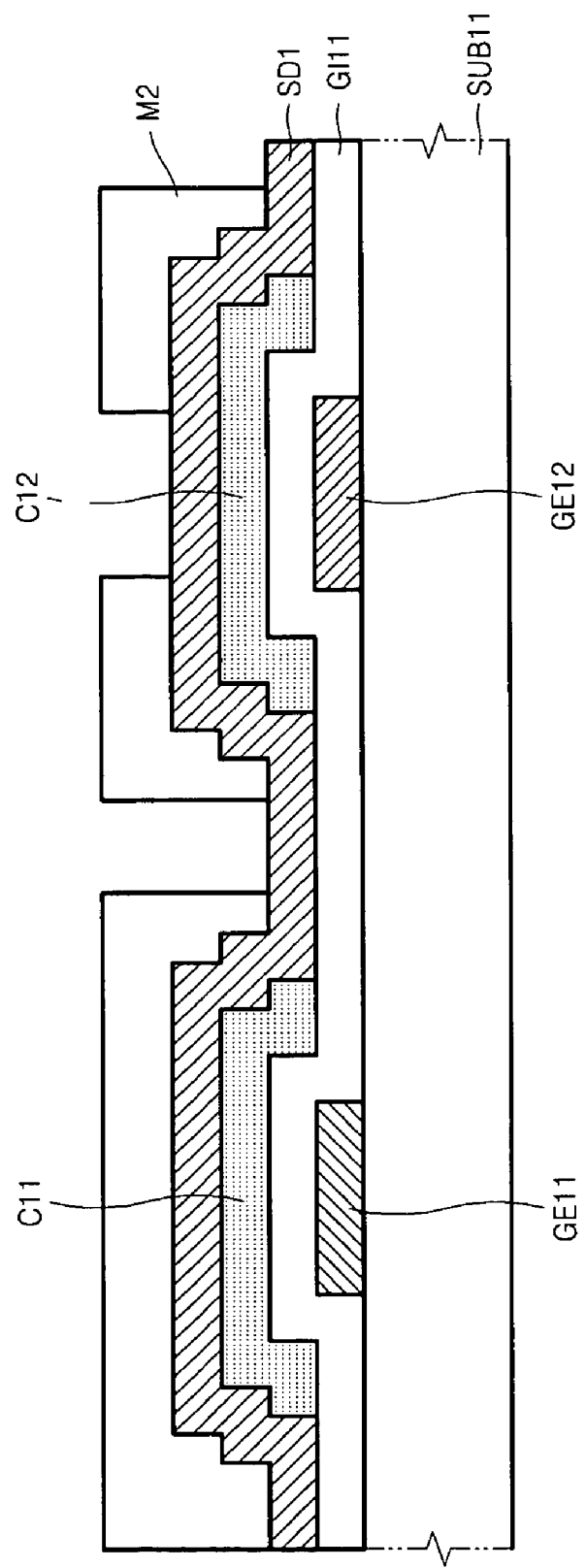

FIGS. 13A through 13D are cross-sectional views illustrating a method of manufacturing an electrical device according to example embodiments. Referring to FIG. 13A, a structure identical to the structure of FIG. 12A may be formed, and a second mask layer M2 defining a second source electrode S12 and a second drain electrode D12 may be formed on the source/drain material layer SD1.

Figure 13B:
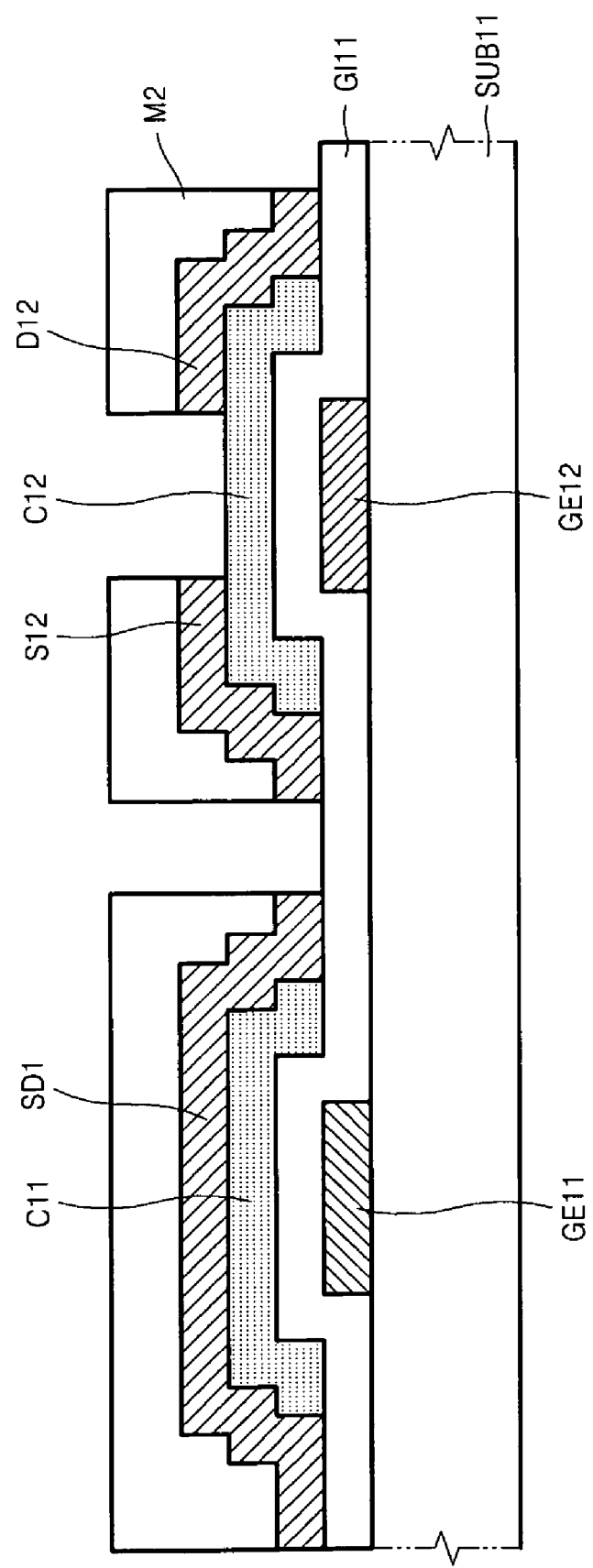

A second source electrode S12 and a second drain electrode D12 may be formed as illustrated in FIG. 13B by etching the source/drain material layer SD1 using the second mask layer M2 as an etching barrier. An etching gas that selectively etches the source/drain material layer SD1 only and that does not etch the second channel layer C12 may be used. For example, when the source/drain material layer SD1 is a metal, e.g., Mo, and the second channel layer C12 is an oxide, $SF_6$-based etching gas may be used to etch the source/drain material layer SD1. Accordingly, the second channel layer C12 may be hardly etched or not etched at all. After removing the second mask layer M2, a third mask layer M3 that is used to define a first source electrode S11 and a first drain electrode D11 (see FIG. 13D) may be formed as illustrated in FIG. 13C.

Figure 13D:
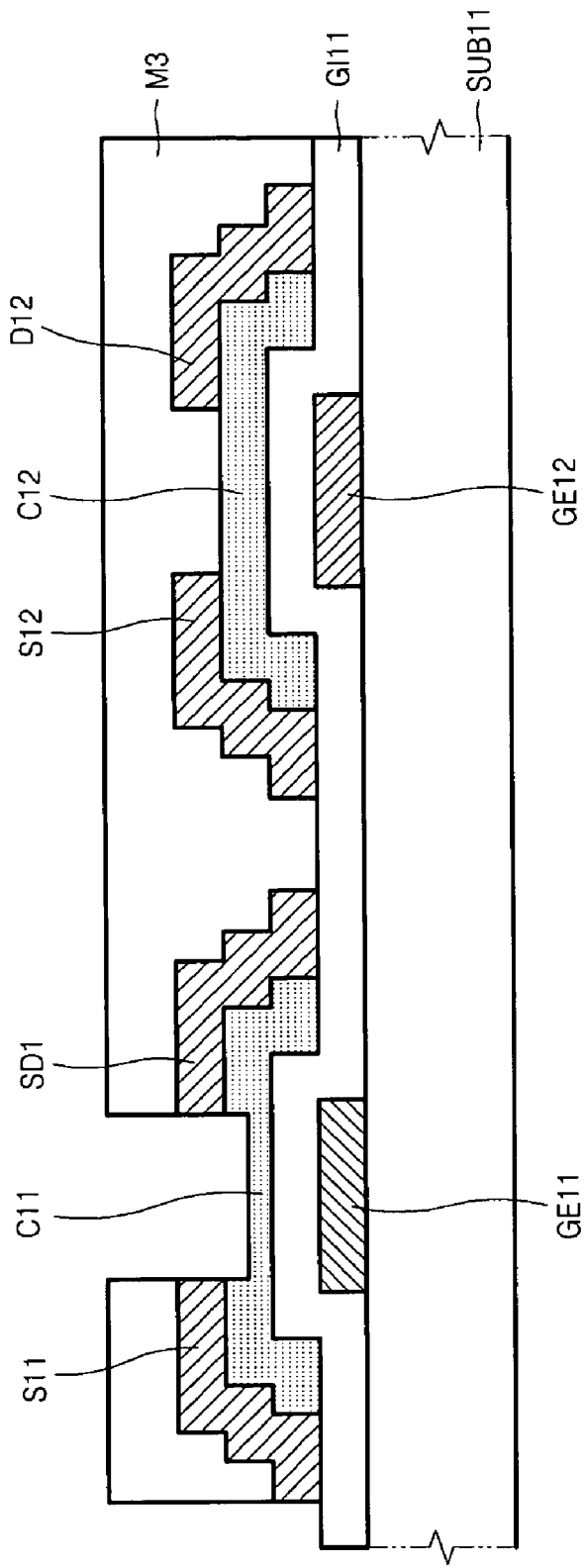

By using the third mask layer M3 as an etching barrier, the source/drain material layer SD1 above the first gate electrode GE11 may be etched, and a portion of the first channel layer C11 may be etched. The result of the etching is illustrated in FIG. 13D. Referring to FIG. 13D, as the result of the etching, a first source electrode S11 and a first drain electrode D11 may be formed, and a portion of the first channel layer C11 between the first source electrode S11 and the first drain electrode D11 may be recessed to a predetermined or given thickness. In the current operation, the source/drain material layer SD1 and the first channel layer C11 may be etched using different methods. In example embodiments, the source/drain material layer SD1 may be etched using a dry etching method that uses etching gas having a high selectivity with respect to the source/drain material layer SD1, and the portion of the first channel layer C11 may be etched using a wet etching method or a dry etching method that uses etching gas having high selectivity with respect to the first channel layer C11.

For example, the source/drain material layer SD1 may be etched using $SF_6$-based etching gas, and the portion of the first channel layer C11 between the first source electrode S11 and the first drain electrode D11 may be etched using an etching solution containing at least one of hydrochloric acid, fluoric acid, phosphoric acid and acetic acid, or using Cl-based etching gas. According to example embodiments, etching the source/drain material layer SD1 and the first channel layer C11 may be performed using the same etching method. In example embodiments, the source/drain material layer SD1 and the portion of the first channel layer C11 may be etched using a dry etching method. For example, the source/drain material layer SD1 and the portion of the first channel layer C11 may be etched continually using Cl-based etching gas.

Although not illustrated in the drawing, the third mask layer M3 is removed, and a passivation layer covering the first and second channel layers C11 and C12, the first and second source electrodes S11 and S12, and the first and second drain electrodes D11 and D12 may be formed, and the resultant product may be annealed at a predetermined or given temperature.

Although the methods described with reference to FIGS. 12A through 12D and 13A through 13D relate to a method of manufacturing the electrical device of FIG. 7, one of ordinary skill in the art may apply the method with respect to FIGS. 12A through 12D or the method with respect to FIGS. 13A through 13D to manufacture the electrical device of FIG. 8.

It should be understood that example embodiments should be considered in a descriptive sense only and not for purposes of limitation. For example, it will be understood by those of ordinary skill in the art that example embodiments may be applied to transistors other than TFT. Also, it will be understood by those of ordinary skill in the art that the structure and elements of the inverter of FIGS. 1, 6 through 8 may be modified in various ways.

In detail, instead of forming a source layer and a drain layer at both ends of the channel layer, a source region and a drain region may be formed inside the ends of the channel layer. The source region and the drain region may be formed by plasma-treating the ends of the channel layer. Also, the channel layer of the semiconductor device according to example embodiments may have a multi-layer structure instead of a single-layer structure. In addition, the methods of manufacturing the semiconductor device of FIGS. 12A through 12D and 13A through 13D may also be modified in various manners. Therefore, the scope of example embodiments may not be defined by the detailed description but by the appended claims.

What is claimed is:

1. An inverter comprising:
a driving transistor including a first channel layer, and a first source and a first drain configured to contact both ends of the first channel layer; and
a load transistor connected to the driving transistor and including a second channel layer, and a second source and a second drain configured to contact both ends of the second channel layer,
wherein the first and second channel layers include a ZnO-based oxide,
the first channel layer has a recess region between the first source and the first drain, so that the first channel layer in the recess region has a thickness smaller than the second channel layer, and
the thickness of the first channel layer in the recess region is about 1 nm-about 50 nm.

2. The inverter of claim 1, wherein a thickness of the first channel layer covered by the first source and the first drain is about 10 nm to several hundreds of nm.

3. The inverter of claim 1, wherein the second channel layer of the load transistor has an overall uniform thickness.

4. The inverter of claim 1, wherein the driving transistor is an enhancement mode transistor, and the load transistor is a depletion mode transistor.

5. The inverter of claim 1, wherein at least one of the driving transistor and the load transistor has a bottom-gate structure.

6. The inverter of claim 1, wherein at least one of the driving transistor and the load transistor has a top-gate structure.

7. The inverter of claim 1, wherein at least one of the driving transistor and the load transistor has a double-gate structure.

8. A logic device comprising a plurality of the inverters according to claim 1.

9. The logic device of claim 8, wherein the driving transistor and the load transistor of each of the plurality of inverters include a top gate and one of the driving transistor and the load transistor further includes a bottom gate, and
the bottom gate of each of the plurality of inverters is separated from a top gate which corresponds to the bottom gate and the bottom gates are electrically connected to one another.

10. The logic device of claim 8, wherein the driving transistor and the load transistor of each of the plurality of inverters include a bottom gate and one of the driving transistor and the load transistor further includes a top gate, and
the top gate of each of the plurality of inverters is separated from a bottom gate which corresponds to the top gate and the top gates are electrically connected to one another.

11. The logic device of claim 8, wherein the logic device is one of a NAND circuit, a NOR circuit, an encoder, a decoder, a multiplexer (MUX), a demultiplexer (DEMUX), and a sense amplifier.

* * * * *